United States Patent
Nagawa

(10) Patent No.: US 8,368,086 B2
(45) Date of Patent: *Feb. 5, 2013

(54) LIGHT-EMITTING DEVICE HAVING A GAIN REGION AND A REFLECTOR

(75) Inventor: Michifumi Nagawa, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/327,041

(22) Filed: Dec. 15, 2011

(65) Prior Publication Data

US 2012/0126271 A1    May 24, 2012

Related U.S. Application Data

(63) Continuation of application No. 12/638,106, filed on Dec. 15, 2009, now Pat. No. 8,106,405.

(30) Foreign Application Priority Data

Dec. 19, 2008  (JP) ................................. 2008-324291

(51) Int. Cl.
*H01L 51/50* (2006.01)
(52) U.S. Cl. .................. 257/79; 257/E33.055
(58) Field of Classification Search .............. 257/75–80, 257/E33.055
See application file for complete search history.

(56) References Cited

U.S. PATENT DOCUMENTS

| | | | |
|---|---|---|---|
| 4,935,930 A | 6/1990 | Handa | |
| 6,399,407 B1 * | 6/2002 | O'Brien et al. | 438/29 |
| 6,803,604 B2 | 10/2004 | Takahashi et al. | |
| 6,804,281 B1 * | 10/2004 | Walpole et al. | 372/45.01 |
| 7,369,583 B2 * | 5/2008 | Ledentsov et al. | 372/20 |
| 7,423,294 B2 * | 9/2008 | Koda et al. | 257/80 |
| 7,751,455 B2 * | 7/2010 | Kneissl | 372/45.01 |
| 7,791,085 B2 * | 9/2010 | Koda et al. | 257/84 |
| 7,842,939 B2 | 11/2010 | Jorgenson et al. | |
| 7,846,751 B2 | 12/2010 | Wang | |
| 7,906,791 B2 | 3/2011 | Nakahara | |
| 2001/0010372 A1 | 8/2001 | Takeuchi et al. | |
| 2001/0028062 A1 | 10/2001 | Uemura et al. | |
| 2003/0020074 A1 * | 1/2003 | Macomber et al. | 257/79 |
| 2006/0054899 A1 | 3/2006 | Takahashi et al. | |
| 2010/0295065 A1 * | 11/2010 | Nakayama | 257/84 |
| 2011/0026108 A1 | 2/2011 | Takahashi et al. | |

FOREIGN PATENT DOCUMENTS

| | | |
|---|---|---|
| JP | 01-184971 | 7/1989 |
| JP | 11-064789 | 3/1999 |
| JP | 2000-244009 | 9/2000 |

(Continued)

OTHER PUBLICATIONS

JPO Office Action regarding JP2008-324291 dated Dec. 7, 2011 with English translation, 8 pages.

*Primary Examiner* — Nathan Ha
(74) *Attorney, Agent, or Firm* — Harness, Dickey & Pierce, P.L.C.

(57) ABSTRACT

A light-emitting device has a first cladding layer, an active layer formed above the first cladding layer, a second cladding layer formed above the active layer, a gain region, and a reflecting part. The active layer has first and second side surfaces parallel to each other. The gain region has a first end surface disposed on the first side surface. The gain region also has a second end surface disposed inside from the second side surface and angled relative to the second side surface. The second end surface, the gain region and the first end surface are provided in a first normal direction relative to the second end surface. The reflecting part is disposed next to the second end surface.

14 Claims, 7 Drawing Sheets

FOREIGN PATENT DOCUMENTS

| | | |
|---|---|---|
| JP | 2001-111177 | 4/2001 |
| JP | 2007-219561 | 8/2007 |
| JP | 2009238828 | 10/2009 |
| JP | 2009238844 | 10/2009 |
| JP | 2009238846 | 10/2009 |
| JP | 2010016172 | 1/2010 |

* cited by examiner

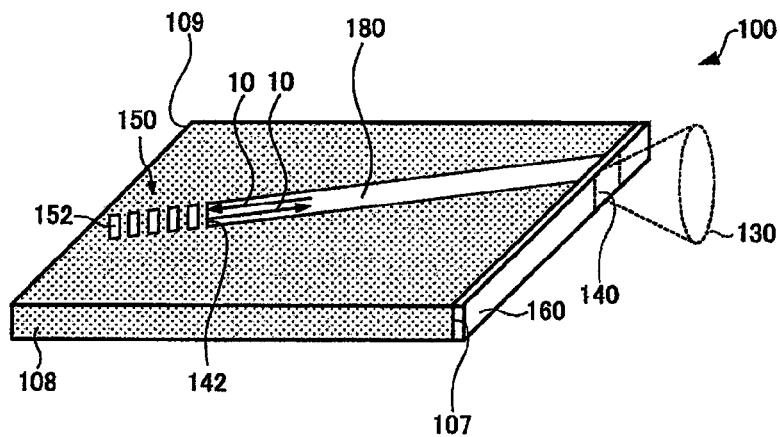
F I G. 1
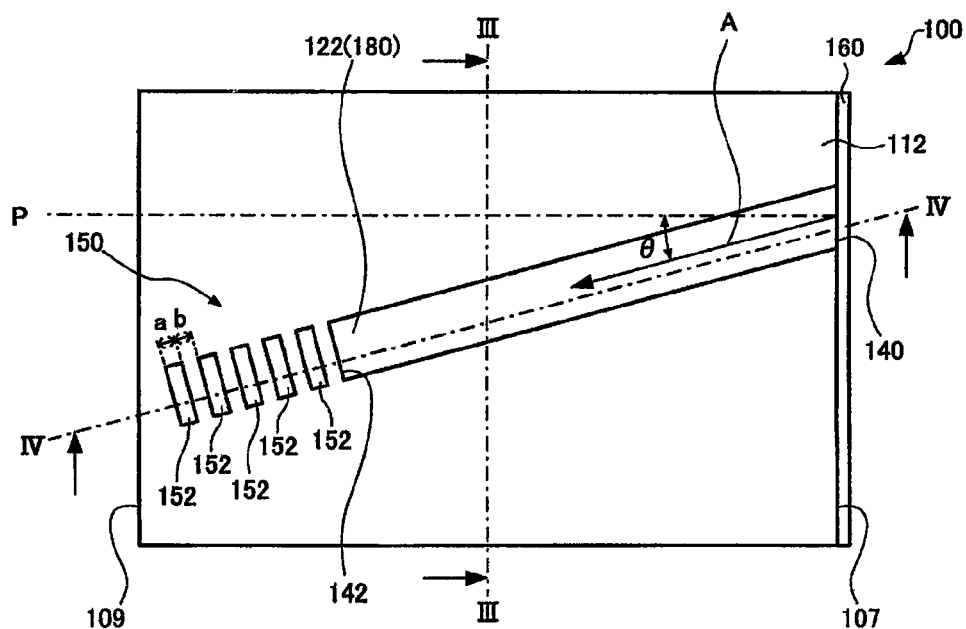
F I G. 2

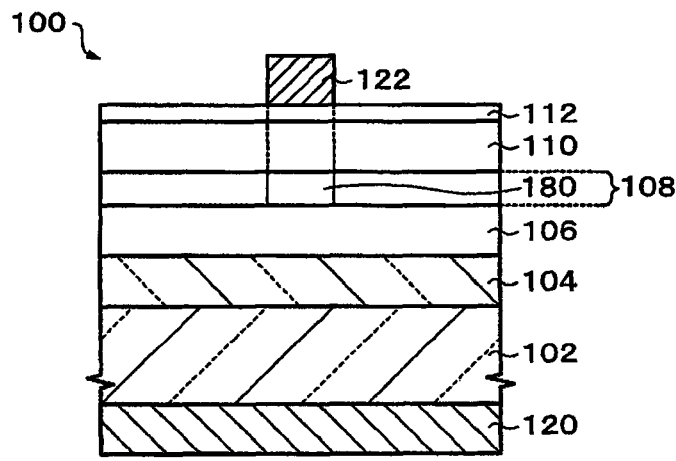
F I G. 3
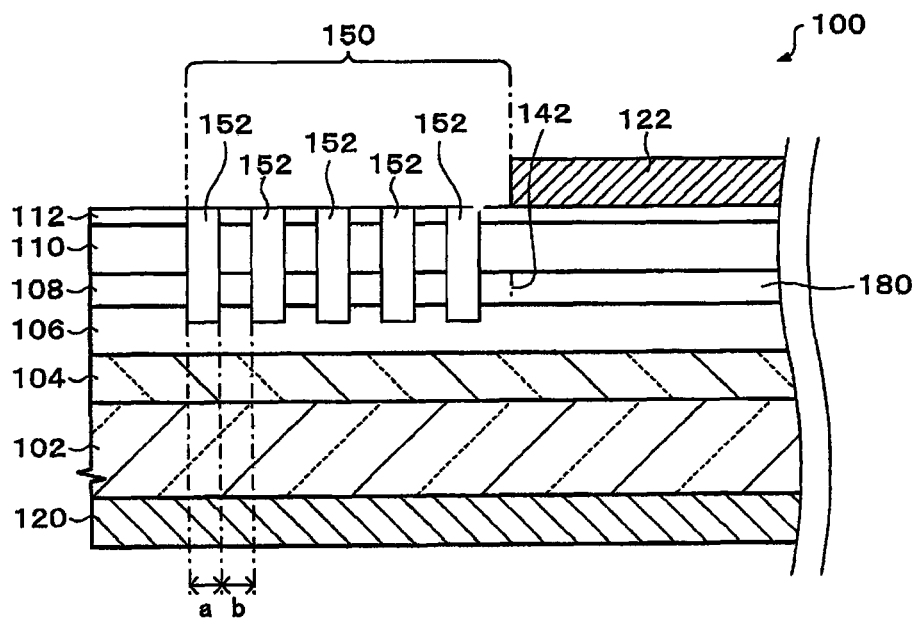
F I G. 4
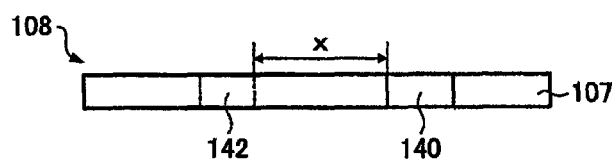
F I G. 5

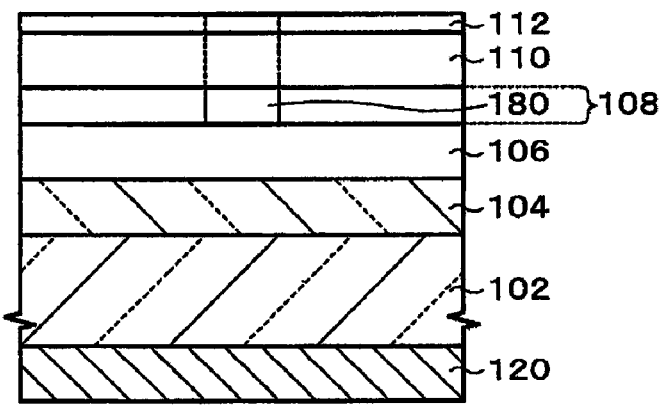
F I G. 6
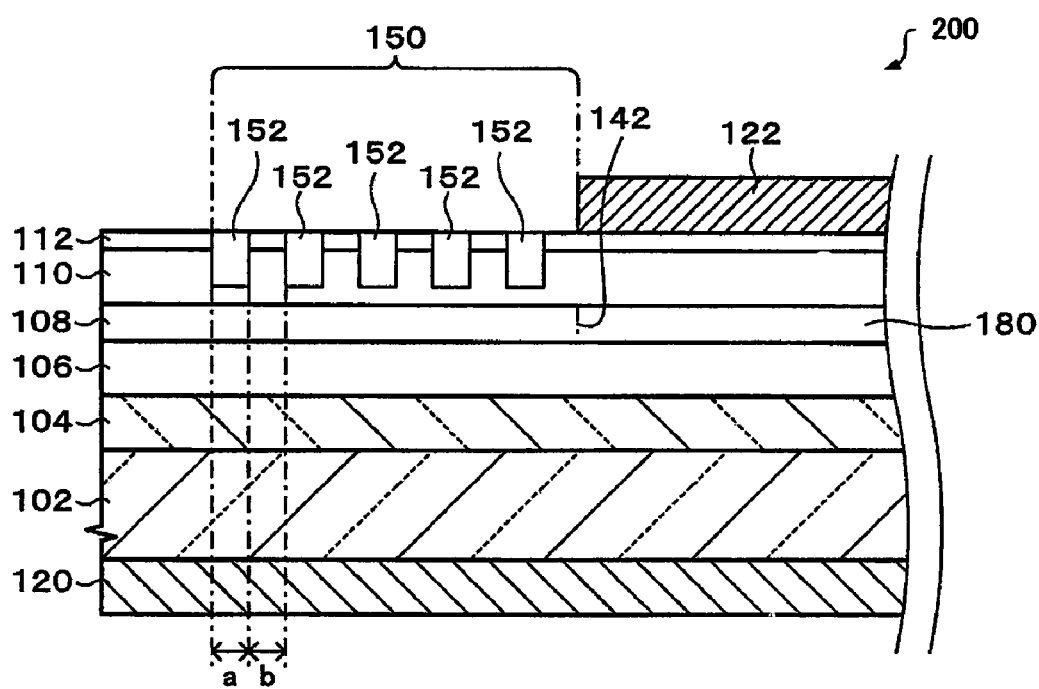
F I G. 7

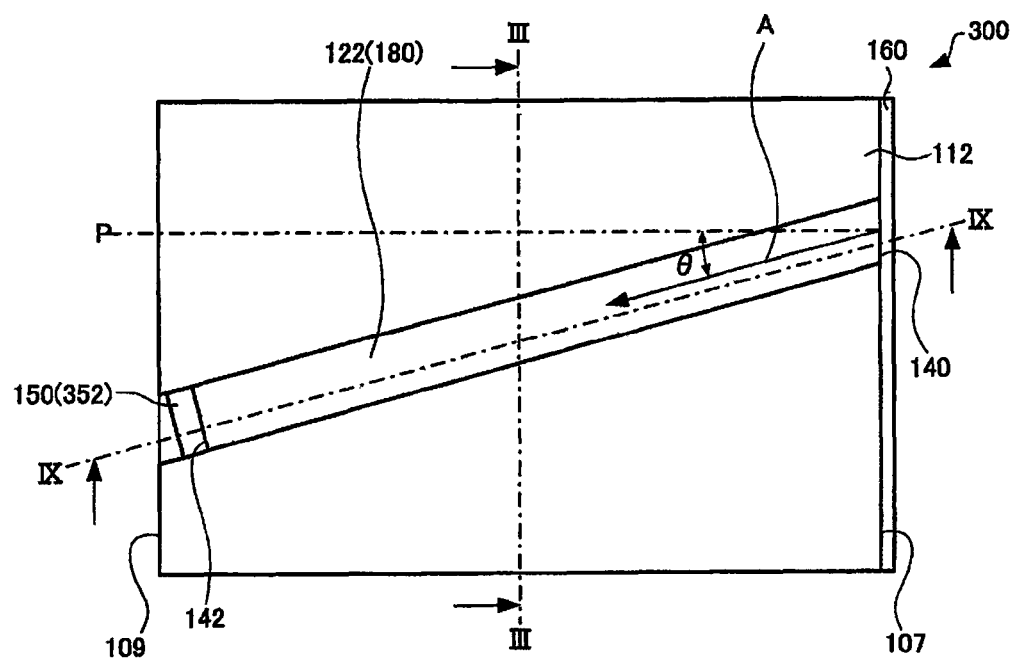
F I G. 8
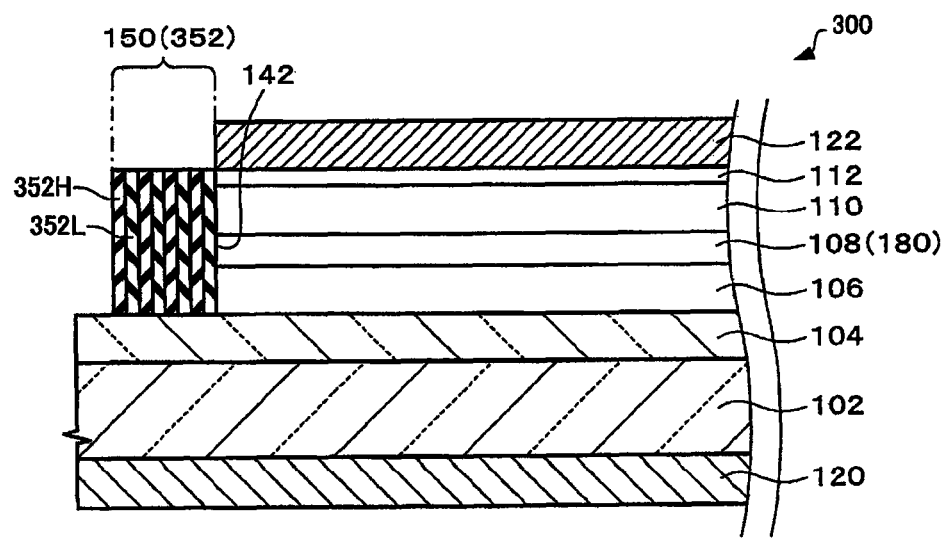
F I G. 9

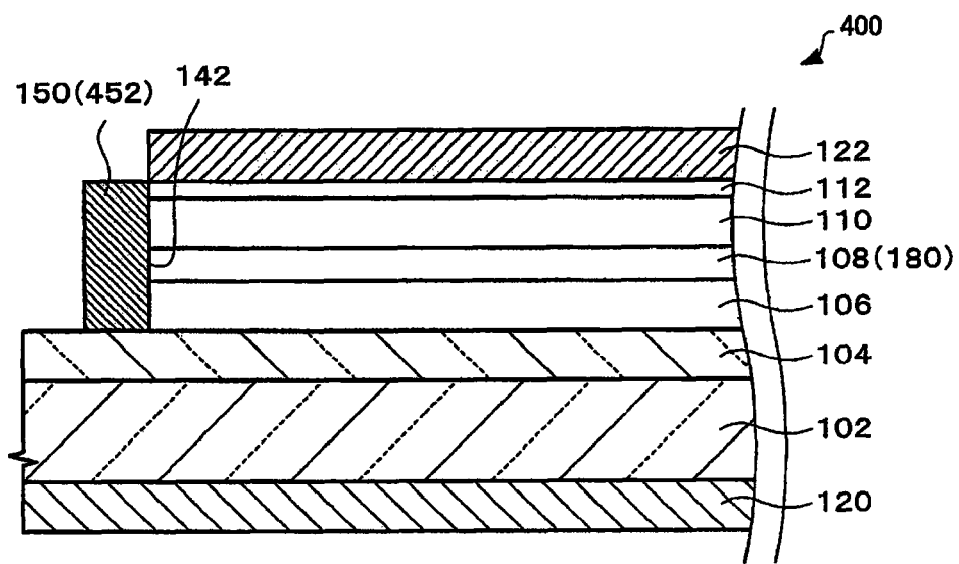
F I G. 10
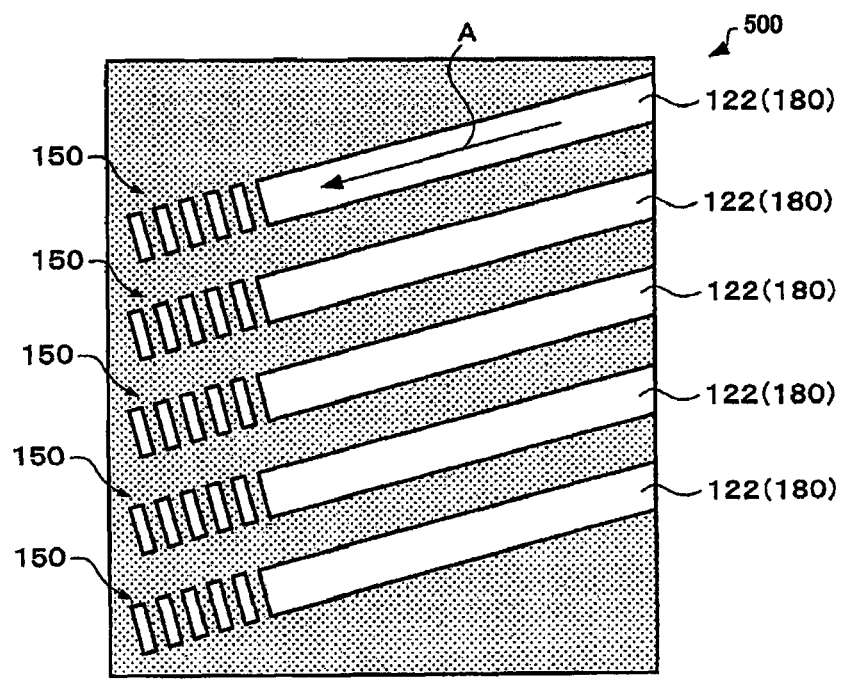
F I G. 11

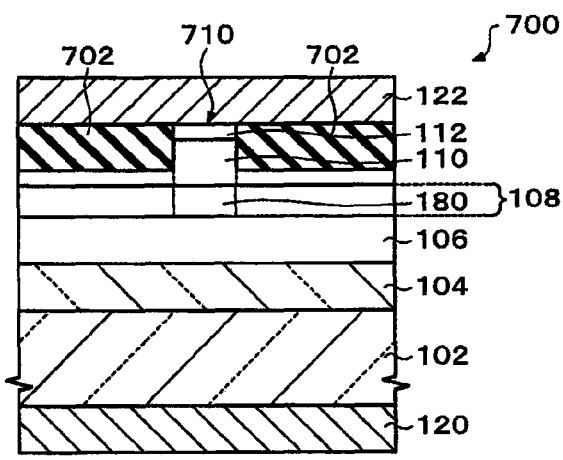
F I G. 14
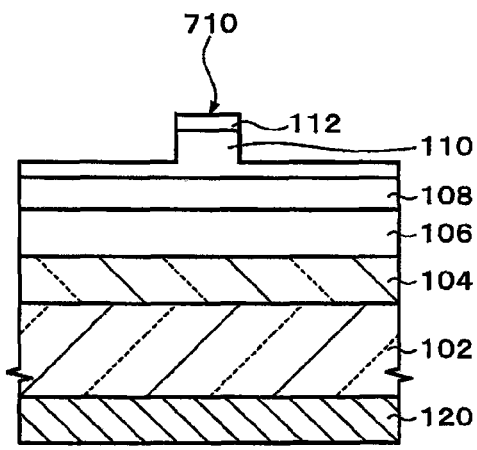
F I G. 15
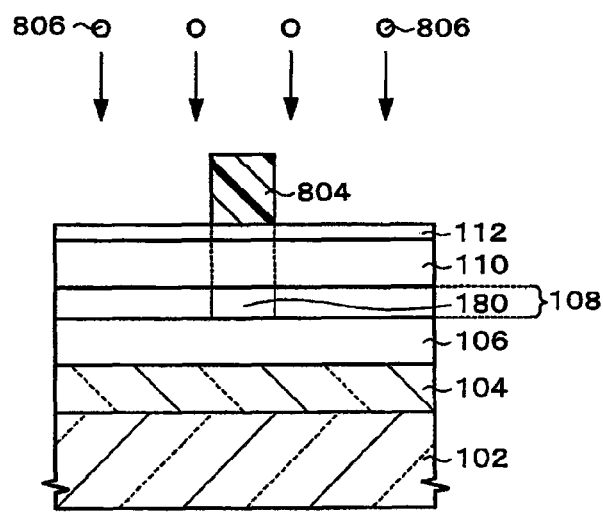
F I G. 16

LIGHT-EMITTING DEVICE HAVING A GAIN REGION AND A REFLECTOR

CROSS-REFERENCE TO RELATED APPLICATION

This is a continuation application of U.S. Ser. No. 12/638,106 filed Dec. 15, 2009 that claims priority to Japanese Patent Application No. 2008-324291, filed on Dec. 19, 2008, all of which are incorporated herein by reference in their entireties.

BACKGROUND

1. Technical Field

The present invention relates to a light-emitting device.

2. Related Art

High-intensity laser devices having excellent color reproducibility show great promise as light-emitting devices that serve as a light source for projectors, displays, and other display devices. However, speckle noise components generated when randomly reflected rays of light at the screen surface interfere with each other. In response to this problem, Japanese Laid-open Patent Application No. 11-64789, for example, proposes a method for reducing speckle noise by sliding the screen to vary the speckle pattern.

However with the method disclosed in Japanese Laid-open Patent Application No. 11-64789, there are cases in which new problems arise; i.e., the screen is limited, a motor and other components are required to move the screen, and the motor or the like generate noise.

It is possible to consider using a common LED (light-emitting diode) as a light-emitting device for a light source in order to reduce speckle noise. However, sufficient light output cannot be obtained using an LED. An object of the present invention is to provide a novel light-emitting device which has high output and can reduce speckle noise.

SUMMARY

In order to solve the above problems, a light-emitting device of the present invention comprises:
a first cladding layer;
an active layer formed above the first cladding layer; and
a second cladding layer formed above the active layer, wherein
the active layer has a first side surface, and a second side surface parallel to the first side surface;
at least a portion of the active layer constitutes a gain region;
the gain region has a first end surface disposed on the first side surface side and a second end surface disposed on the second side surface side, and extends from the first end surface to the second end surface in the direction inclined to the normal to the first side surface as viewed from above;
the second end face is orthogonal to the direction in which the gain region extends as viewed from above;
a reflecting part is disposed on the second end face; and a part of the light generated in the gain region is reflected in the reflecting part disposed on the second end face and is emitted from the first end surface In the structure above, laser oscillation of light generated in the gain region can be suppressed or prevented in the manner described below. Therefore, speckle noise can be reduced. With the light-emitting device of the present invention, the light generated in the gain region advances while increasing gain in the gain region and can be emitted to the exterior. Therefore, a higher output than a conventional LED can be obtained. As described above, speckle noise can be reduced, and a novel, high-output light-emitting device can be provided in accordance with the present invention.

In the description of the present invention, the term "above" is used for referring to, e.g., a specific member (hereinafter referred to as "member A") or the like that is formed "above" another specific member (hereinafter referred as "member B"). Such cases in the description of the present invention include the use of the term "above" when the member A is formed directly on member B, and when the member A is formed on member B via another member.

In the light-emitting device of the present invention, the reflecting part may be a distributed Bragg reflecting mirror.

In the light-emitting device of the present invention, the distributed Bragg reflecting mirror may include a plurality of grooves disposed at predetermined intervals.

In the light-emitting device of the present invention, the grooves are rectangular as viewed from above, and a pair of sides facing the grooves may be parallel to the second end face.

In the light-emitting device of the present invention, the position of the bottom surface of the grooves is disposed below the position of the lower surface of the active layer.

In the light-emitting device of the present invention, the position of the bottom surface of the grooves is disposed above the position of the upper surface of the active layer.

In the light-emitting device of the present invention, the distributed Bragg reflecting mirror includes a dielectric multilayer film in which a high-refractive index layer and a low-refractive index layer are layered in alternating fashion in the direction in which the gain region extends.

In the light-emitting device of the present invention, the reflecting part is a metal mirror.

In the light-emitting device of the present invention, an antireflection film is disposed on the first end surface.

In the light-emitting device of the present invention, the gain region does not overlap the first end surface and the second end surface as viewed from above from the first side surface side.

In the light-emitting device of the present invention, a plurality of gain regions is provided.

In the light-emitting device of the present invention, there may be included a first electrode electrically connected to the first cladding layer; and a second electrode electrically connected to the second cladding layer.

In the description of the present invention, the phrase "electrically connected" is used for referring to, e.g., a specific member (hereinafter referred to as "member C") or the like that is "electrically connected" to another specific member (hereinafter referred as "member D"). Such cases in the description of the present invention include the use of the phrase "electrically connected" when the members C and D are directly electrically connected and when the members C and D are electrically connected via another member.

BRIEF DESCRIPTION OF THE DRAWINGS

The invention will be described with reference to the accompanying drawings, wherein like numbers reference like elements.

FIG. 1 is a perspective view schematically showing the light-emitting device of the first embodiment.

FIG. 2 is a cross-sectional view schematically showing the light-emitting device of the first embodiment.

FIG. 3 is a cross-sectional view schematically showing the light-emitting device of the first embodiment.

FIG. 4 is a cross-sectional view schematically showing the light-emitting device of the first embodiment.

FIG. 5 is a view of the first embodiment as seen from above from the first side surface side.

FIG. 6 is a cross-sectional view schematically showing the steps for manufacturing the light-emitting device of the first embodiment.

FIG. 7 is a cross-sectional view schematically showing a first modified example of the light-emitting device of the first embodiment.

FIG. 8 is a plan view schematically showing a second modified example of the light-emitting device of the first embodiment.

FIG. 9 is a cross-sectional view schematically showing a second modified example of the emission device of the first embodiment.

FIG. 10 is a cross-sectional view schematically showing a third modified example of the light-emitting device of the first embodiment.

FIG. 11 is a plan view schematically showing a fourth modified example of the light-emitting device of the first embodiment.

FIG. 14 is a cross-sectional view schematically showing the light-emitting device of the second embodiment.

FIG. 15 is a cross-sectional view schematically showing the steps for manufacturing the light-emitting device of the second embodiment.

FIG. 16 is a cross-sectional view schematically showing a modified example of the steps for manufacturing the light-emitting device of the second embodiment.

DESCRIPTION OF EXEMPLARY EMBODIMENTS

Figure 12:
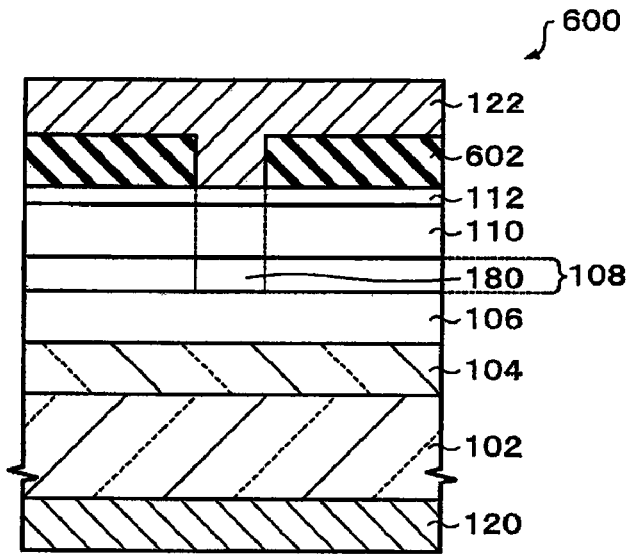
FIG. 12 is a cross-sectional view schematically showing a fifth modified example of the light-emitting device of the first embodiment.

Embodiments of the invention will be described.
First Embodiment

The light-emitting device 100 of the first embodiment will be described first.

FIG. 1 is a perspective view schematically showing the light-emitting device 100. FIG. 2 is a plan view schematically showing the light-emitting device 100. FIG. 3 is a cross-sectional view along the line III-III of FIG. 2. FIG. 4 is a cross-sectional view along the line IV-IV of FIG. 2. In FIG. 1, members other than the active layer 108, the reflective part 150, and the antireflective film 160 are omitted from the drawing for the sake of convenience. Described here is the case in which the light-emitting device 100 is an InGaAlP-type (red) semiconductor light-emitting device.

The light-emitting device 100 includes a first cladding layer 106, an active layer 108, a second cladding layer 110, and a reflective part 150, as shown in FIGS. 1 to 4. The light-emitting device 100 may further include, e.g., a first electrode 120, a second electrode 122, a substrate 102, a buffer layer 104, a contact layer 112, and an antireflective film 160.

The substrate 102 may be, e.g., a first electroconductive type (e.g., an n-type) GaAs substrate or the like.

The buffer layer 104 may be formed on the substrate 102, as shown in FIG. 3, for example. The buffer layer 104 can improve the crystallinity of a layer formed above the buffer layer, for example. The buffer layer 104 may be a first electroconductive type (n-type) GaAs layer, InGaP layer, or the like having better crystallinity (e.g., low defect density) than the substrate 102, for example.

The first cladding layer 106 is formed on the buffer layer 104. The first cladding layer 106 is composed of, e.g., a first electroconductive-type semiconductor. The first cladding layer 106 may be, e.g., an n-type AlGaP layer.

The active layer 108 is formed on the first cladding layer 106. The active layer 108 has a multi-quantum well (MQW) structure in which three quantum well structures composed of, e.g., an InGaP well layer and an InGaAlP barrier layer are superimposed.

A part of the active layer 108 is composed of a gain region. Light may be generated in the gain region 180 and this light may increase in gain inside the gain region 180. The active layer 108 is in the shape of, e.g., a rectangular parallelepiped (including a cube). The active layer 108 has a first side surface 107 and a second side surface 109, as shown in FIGS. 1 and 2. The first side surface 107 and the second side surface are parallel.

The gain region 180 has a first end surface 140 of the first side surface 107 side, and a second end surface 142 of the second side surface 109 side. The first end surface 140 may be provided to the first side surface 107. The second end surface 142 is provided in any location in the region in which the active layer 108 is formed, as shown in FIG. 1. In other words, the gain region 180 does not reach the second side surface 109 in the example in the drawing, and the second end surface 142 is not provided to the second side surface 109. In the wavelength band of the light generated by the gain region 180, the reflectivity of the second end surface 142 is greater than the reflectivity of the first end surface 140. The reflectivity of the second end surface 142 is preferably 100% or nearly 100%. In contrast, the reflectivity of the first end surface 140 is preferably 0% or nearly 0%. Low reflectivity can be obtained by disposing, e.g., the antireflective film 160 on the first end surface 140. The antireflective film 160 may be provided to the entire first side surface 107, as shown in the drawing, or may be provided solely to the first end surface 140. Examples of the antireflective film 160 that may be used include a single-layer $Al_2O_3$, and $SiO_2$ layer, a SiN layer, a $Ta_2O_5$ layer, or a multilayer film composed of the preceding layers. The second end surface 142 can be made highly reflective by providing a later-described reflective part 150. The second end surface 142 is disposed so as to be orthogonal to the direction A in which the gain region 180 extends, as shown in FIG. 2. The light generated in the gain region 180 can thereby be reflected with good efficiency in the reflective part 150 provided to the second end surface 142.

The gain region 180 extends from the first end surface 140 to the second end surface 142 in the direction inclined to the normal P to the first side surface 107 as viewed from above (see FIG. 2). In the example in the drawing, the gain region 180 extends in the direction A inclined with respect to the normal P at an angle θ. The gain region 180 extends in the direction A inclined with respect to the normal P to the first side surface 107, whereby laser oscillation of the light generated in the gain region 180 can be suppressed or prevented. The direction A in which the gain region 180 extends may refer to the direction that connects the center of the second end surface 142 and the center of the first end surface 140 of the gain region 180 as viewed from above, for example.

FIG. 5 is a plan view of the active layer 108 in the example of FIGS. 1 to 4 as seen from the first side surface 107 side. In the gain region 180, the first end surface 140 and the second end surface 142 are superimposed, as shown in FIG. 5. Light generated in the gain region 180 can thereby be directly prevented from multiply reflecting between the first end surface 140 and the second end surface 142. As result, since the configuration can be prevented from constituting a direct resonator, the laser oscillation of light generated in the gain region 180 can be more reliably suppressed or prevented. Therefore, the light-emitting device 100 can emit light that is not laser light. In this case, for example, the displacement width x between the first end surface 140 and the second end surface 142 can be a positive value in the gain region 180, as shown in FIG. 5. The first end surface 140 and the second end surface 142 of a single gain region 180 do not overlap. Although not depicted in the drawing, the first end surface 140 of one gain region 180 may overlap the second end surface 142 of another gain region 180.

The reflective part 150 is provided to the second end surface 142 of the gain region 180. The reflective part 150 may be a distributed Bragg reflecting mirror (DBR, hereinafter referred to "DBR mirror"). The reflective part 150 is composed of a plurality of grooves 152 disposed a predetermined intervals in the example in the drawing. The planar shape of the grooves 152 is, e.g., rectangular. A pair of sides (the long sides in the example of FIG. 2) facing the grooves 152 is provided parallel to the second end surface 142, as shown in FIG. 2. The position of the bottom surface of the grooves 152 is provided lower than the position of the lower surface of the active layer 108 in the example of FIG. 4. The interior of the grooves 152 may be a cavity or may be filled with an insulating material. The grooves 152 may be disposed so that the width a is $(2m_a-1)\lambda/4n_a$, and the interval b is $(2m_b-1)\lambda/4n_b$. The variables $m_a$ and $m_b$ are natural numbers, $\lambda$ is the wavelength of light generated in the gain region 180, $n_a$ is the index of refraction in the grooves 152, and $n_b$ is the index of refraction in the active layer 108. Accordingly, the DBR mirror can be configured by disposing the grooves 152 having a predetermined width at predetermined intervals. In the example of the drawing, five grooves 152 are provided, but the number of grooves is not limited. A DBR mirror having a higher refractive index can be obtained by increasing the number of grooves 152.

The second cladding layer 110 is formed on the active layer 108. The second cladding layer 110 is composed of, e.g., a second electroconductive type (e.g., p-type) semiconductor. The second cladding layer 110 may be, e.g., a p-type AlGaP layer.

For example, a pin diode is composed of the p-type second cladding layer 110, the active layer 108 in which impurities have not been doped, and the n-type first cladding layer 106. The first cladding layer 106 and the second cladding layer 110 are layers with a low refractive index and in which the forbidden bandwidth is greater than the active layer 108. The active layer 108 has a function for increasing the amplitude of light. The first cladding layer 106 and the second cladding layer 110 sandwiches the active layer 108, has a function for sealing in light, and functions as an injection barrier (electrons and positive holes).

In the light-emitting device 100, electrons and positive holes recombine in the gain region 180 of the active layer 108 when a normal bias voltage of a pin diode is applied between the first electrode 120 and the second electrode 122. Light is emitted by this recombination. Induced emissions occur in a chain-like fashion started by the generated light, and the intensity of the light inside the gain region 180 is amplified. For example, a part of the light 10 generated in the gain region 180 is reflected in the reflective part 150 provided to the second end surface 142, as shown in FIG. 1, and is emitted from the first end surface 140 as emitted light 130. The light intensity is amplified in this interval. Light generated in the gain region 180 includes light directly emitted from the first end surface 140 as emitted light 130.

The contact layer 112 may be formed on the second cladding layer 110, as shown in FIG. 3, for example. A layer that makes ohmic contact with the second electrode 122 may be used as the contact layer 112. The contact layer 112 is composed of, e.g., a second electroconductive-type semiconductor. For example, a p-type GaAs layer may be used as the contact layer 112.

The first electrode 120 is formed over the entire lower surface of the substrate 102, as shown in FIG. 3, for example. The first electrode 120 may be in contact with the layer (the substrate 102 in the example of the drawing) that is in ohmic contact with the first electrode 120. The first electrode 120 is electrically connected to the first cladding layer 106 via the substrate 102 and the buffer layer 104. The first electrode 120 is one electrode for driving the light-emitting device 100. For example, the first electrode 120 may be one in which a Cr layer, a AuGe layer, a Ni layer, and a Au layer are layered in sequence from the substrate 102 side. A second contact layer (not shown) is disposed between the first cladding layer 106 and the buffer layer 104, the second contact layer is exposed by the dry etching or the like, and the first electrode 120 may be disposed on the second contact layer. Therefore, a single-side electrode structure can be obtained. This arrangement is particularly effective in the case that the substrate 102 is insulative. An example of the insulative substrate 102 is a semi-insulating GaAs substrate. For example, an n-type GaAs layer or the like may be used as the second contact layer. Although not shown, the substrate 102 and a member disposed thereon can be cut away using, e.g., epitaxial lift off (ELO), laser lift off, or the like. In other words, the light-emitting device 100 can be used without having the substrate 102. In this case, the first electrode 120 can be formed directly below the buffer layer 104, for example. This arrangement is also particularly effective in the case that the substrate 102 is insulative.

The second electrode 122 is formed on the contact layer 112. The second electrode 122 is electrically connected to the second cladding layer 110 via the contact layer 112. The second electrode 122 is another electrode for driving the light-emitting device 100. For example, the second electrode 122 may be one in which a Cr layer, a AuZn layer, and a Au layer are layered in sequence from the contact layer 112 side. The lower surface of the second electrode 122 has a flat shape in the same manner as the gain region 180, as shown in FIG. 2. In the example of the drawing, the flat surface shape of the contact surface between the second electrode 122 and the contact layer 112 may determine the electric current pathway between the electrodes 120, 122, and as a result, may determine the flat surface shape of the gain region 180. Although not shown, the contact surface between the first electrode 120 and the substrate 102 may have, e.g., the same flat surface shape as the gain region 180.

The light-emitting device 100 of the present embodiment can be applied as a light source for, e.g., a projector, a display, an illumination device, and a measuring device. This also applies to the embodiments described below.

The light-emitting device 100 has the following features, for example.

With the light-emitting device 100 of the present embodiment, laser oscillation of light generated in the gain region 180 can be suppressed or prevented as described above. Therefore, speckle noise can be reduced. Furthermore, with the light-emitting device 100 of the present invention, the light generated in the gain region 180 advances while increasing gain in the gain region 180 and can be emitted to the exterior. Therefore, a higher output than a conventional LED can be obtained. As described above, speckle noise can be reduced, and a novel, high-output light-emitting device can be provided in accordance with the present invention.

Generally, a light-emitting device that emits light that is not laser light has an absorbing part disposed on the other end surface facing the end surface acting as the emission part of the gain region in order to suppress or prevent laser oscillation. With the light-emitting device 100 of the present embodiment, laser oscillation can be suppressed or prevented without the use of an adsorbing part as described above. Therefore, in accordance with the light-emitting device 100 of the present embodiment, a reflective part 150 may be provided to the second end surface 142 because an absorbing part is not required.

With the light-emitting device 100 of the present embodiment, a part of the light 10 generated in the gain region 180 can be reflected at the reflective part 150 and advance while again increasing in gain in the gain region 180. Therefore, in accordance with the light-emitting device 100 of the present embodiment, high-light output can be obtained because the distance for amplifying the light intensity is increased in comparison with the case in which the light is not reflected at the reflective part 150, for example.

With the light-emitting device 100 of the present embodiment, the reflective part 150 may be a DBR mirror composed of a plurality of grooves 152. Therefore, in accordance with the light-emitting device 100, the device can be made smaller than the case in which the reflective part is disposed outside the light-emitting device 100, and the loss of light between the gain region 180 and the reflective part 150 can be suppressed.

1.2. Next, the method for manufacturing the light-emitting device 100 of the first embodiment will be described with reference to the drawings.

FIG. 6 is a cross-sectional view schematically showing the steps for manufacturing a light-emitting device 100, and corresponds to the cross-sectional view of FIG. 3.

(1) First, the buffer layer 104, the first cladding layer 106, the active layer 108, the second cladding layer 110, and the contact layer 112 are epitaxially grown on the substrate 102, as shown in FIG. 6, for example. Examples of the epitaxial growing method that may be used include metalorganic chemical vapor deposition (MOCVD), and molecular beam epitaxy (MBE).

(2) Next, the grooves 152 constituting the reflective part 150 are formed in the second end surface 142, as shown in FIG. 4. The grooves 152 are formed by patterning using a photolithographic technique and an etching technique.

(3) Next, the antireflective film 160 can be formed on the first end surface 140, as shown in FIGS. 1 and 2, for example. The antireflective film 160 is formed by, e.g., chemical vapor deposition (CVD), sputtering, ion-assisted deposition, or the like.

(4) Next, the second electrode 122 is formed on the contact layer 112, as shown in FIG. 3, for example. The second electrode 122 is obtained by forming an electroconductive layer on the entire surface by, e.g., vacuum deposition, and then patterning the electroconductive layer using a photolithographic technique and an etching technique. The second electrode 122 may be formed in a desired shape using a combination of, e.g., vapor deposition, lift-off, and the like. The grooves 152 may be covered with, e.g., a mask layer (not shown) so as to prevent the entry of electrode material.

Next, the first electrode 120 is formed under the lower surface of the substrate 102, as shown in FIG. 3, for example. The method for manufacturing the first electrode 120 is the same as the example in drawings for the method for manufacturing the second electrode 122 described above. The sequence for forming the first electrode 120 and the second electrode 122 is not particularly limited.

(5) The light-emitting device 100 of the present embodiment is obtained by following the steps described above, as shown in FIGS. 1 to 4.

1.3. A modified example of the light-emitting device of the present embodiment is described next. A description of the points that are different from the example of the light-emitting device 100 shown in FIGS. 1 to 4 described above will be provided and a description of the points that are the same will be omitted.

(1) The first modified example will be described first.

FIG. 7 is a cross-sectional view schematically showing a light-emitting device 200 of the present modified example. The cross-sectional view in FIG. 7 corresponds to FIG. 4.

In the example of the light-emitting device 100, the case in which the position of the bottom surface of the grooves 152 is disposed below the position of the lower surface of the active layer 108, as shown in FIG. 4. In contrast, in the present modified example, the position of the bottom surface of the grooves 152 may be disposed above the position of the upper surface of the active layer 108, as shown in FIG. 7, for example. In accordance with the present modified example, the reflective part 150 may be a DBR mirror having the grooves 152 in the same manner as the example of the light-emitting device 100.

(2) A second modified example will be described next.

FIG. 8 is a plan view schematically showing a light-emitting device 300 of the present modified example. FIG. 9 is a cross-sectional view along the line IX-IX.

In the example of the light-emitting device 100, a case was described in which the reflective part 150 is a DBR mirror composed of a plurality of grooves 152. In contrast, in the present modified example, the reflective part 150 may be a DBR mirror composed of a dielectric multilayer film 352 in which a high-refractive index layer 352H and a low-refractive index layer 352L are layered in alternating fashion in the direction A in which the gain region 180 extends. Examples that may be used as the high-refractive index layer 352H include a SiN layer, a $Ta_2O_5$ layer, a $TiO_2$ layer, and a $ZrO_2$ layer. Examples that may be used as the low-refractive index layer 352L include a $SiO_2$ layer and a $MgF_2$ layer. The high-refractive index layer 352H and the low-refractive index layer 352L may be used as a pair, and in the example of the drawing, four pairs are used, but the number of pairs is not particularly limited. The thickness of the high-refractive index layer 352H may be set to $(2m_H-1)\lambda/4n_H$. The thickness of the low-refractive index layer 352L may be set to $(2m_L-1)\lambda/4n_L$. The variables $m_H$ and $m_L$ are natural numbers, $\lambda$ is the wavelength of light generated in the gain region 180, $n_H$ is the index of refraction of the high-refractive index layer 352H, and $n_L$ is the index of refraction of the low-refractive index layer 352L.

In accordance with the present modified example, the reflective part 150 may be a DBR mirror composed of a dielectric multilayer film 352.

The method for manufacturing the light-emitting device 300 will be described.

First, the buffer layer 104, the first cladding layer 106, the active layer 108, the second cladding layer 110, and the contact layer 112 are epitaxially grown in the listed sequence on the substrate 102 in the same manner as the case of the light-emitting device 100.

Next, the region along the direction A in which the gain region 180 extends is etched from the second end surface 142 to the second side surface 109 so as to expose the region that will form at least the second end surface 142 as seen from the second side surface 109, as shown in FIG. 8. In the example of FIG. 9, the depth of the etching is the lower surface of the first cladding layer 106, but may be a depth that reaches at least the upper surface of the first cladding layer 106. The etching may be carried out by, e.g., dry etching.

Next, the dielectric multilayer film 352 is formed, as shown in FIG. 9, and may be formed by layering the low-refractive index layer 352L and the high-refractive index layer 352H in an alternating fashion from the second side surface 109 side. The film may be formed by fixing the substrate 102 in place in an orientation that allows the layering to be carried out in a uniform fashion in relation to the second end surface 142. The film may be formed by, e.g. chemical vapor deposition (CVD) and sputtering.

Other steps may be carried out in the same manner as used for the light-emitting device 100, and a specific description is therefore omitted.

The light-emitting device 300 of the present modified example is obtained using the steps described above.

(3) A third modified example will be described next.

FIG. 10 is a cross-sectional view schematically showing the light-emitting device 400 of the present modified example. The cross-sectional view shown in FIG. 10 corresponds to FIG. 4.

In the example of light-emitting device 100, a case was described in which the reflective part 150 is a DBR mirror composed of a plurality of grooves 152. In contrast, in the present modified example, the reflective part 150 may be a metal mirror. The metal mirror may be composed of a metal thin film 452 provided to the second end surface 142. The metal thin film 452 is disposed so as to cover at least the second end surface 142. Examples of the material of the metal thin film 452 include aluminum, silver, and gold.

The metal thin film 452 is formed by sputtering, for example. The method for manufacturing the light-emitting device 300 of the present modified example may be the same method for manufacturing the light-emitting devices 100, 200. Therefore, a detailed description is omitted.

(4) A fourth modified will be described next.

FIG. 11 is a plan view schematically showing a light-emitting device 500 of the present modified example. The plan view shown in FIG. 11 corresponds to FIG. 2.

In the example of the light-emitting device 100, a case of a single gain region 180 was described. In contrast, in the present modified example, a plurality of gain regions 180 (five in the example of FIG. 11) may be provided. The reflective part 150 may be provided to each second end surface 142 of the plurality of gain regions 180. In the example of the drawing, the reflective part 150 is a DBR mirror composed of the grooves 152, but the reflective part 150 may be a metal mirror composed of a metal thin film 452 and a DBR mirror composed of the dielectric multilayer film 352 of the modified example described above. The direction A in which the gain regions 180 extend may be the same direction (the example of the drawing) for each gain region 180 or may be different directions.

In accordance with the present modified example, the overall light-emitting device can achieve a higher output than the example of the light-emitting device 100.

(5) A fifth modified example will be described next.

FIG. 12 is a plan view schematically showing a light-emitting device 600 of the present modified example. The cross-sectional view shown in FIG. 12 corresponds to the cross-sectional view shown in FIG. 3 in the example of the light-emitting device 100.

In the example of the light-emitting device 100, the case was described in which the upper and lower surfaces of the second electrode 122 have the same flat surface shape as the gain region 180, as shown in FIGS. 2 and 3. In contrast, in the present modified example, the upper surface of the second electrode 122 may be formed in a flat surface shape that is different from the gain region 180, as shown in FIG. 12. In the present modified example, an insulating layer 602 having an opening is formed on the contact layer 112 and the second electrode 122 for embedding the opening may be formed. The second electrode 122 is formed inside the opening and on the insulating layer (including the opening) 602. In the present modified example, the lower surface of the second electrode 122 has the same flat surface shape as the gain region 180, and the upper surface of the second electrode 122 is the entire surface on the insulating layer 602.

Examples of the insulating layer 602 that may be used include a SiN layer, a $SiO_2$ layer, and a polyimide layer. The insulating layer 602 is formed by, e.g., CVD, coating, or the like.

In accordance with the present modified example, a light-emitting device 600 can be provided having excellent heat dissipation because the volume of the second electrode 122 is increased in comparison with the example of the light-emitting device 100.

(6) A sixth modified example will be described next.

In the example of the light-emitting device 100, the case in which InGaAlP is used was described, but in the present modified example, it is possible to use any material that can form a light-emitting gain region. Examples of the electro-conductive material that can be used include AlGaN, InGaN, GaAs, InGaAs, GaInNAs, and ZnCdSe. In the present modified example, a GaN substrate or the like may be used as the substrate 102, for example. In the present modified example, an organic material or the like may be used.

(7) The modified examples described above are examples and no limitation is imposed thereby. For example, the modified example can be used in suitably combinations. These modified examples may be applied to the embodiment described below as required.

2. Second Embodiment 2.1. Next, the light-emitting device 700 of the second embodiment will be described next, but no limitation is imposed by the following example.

Figure 13:
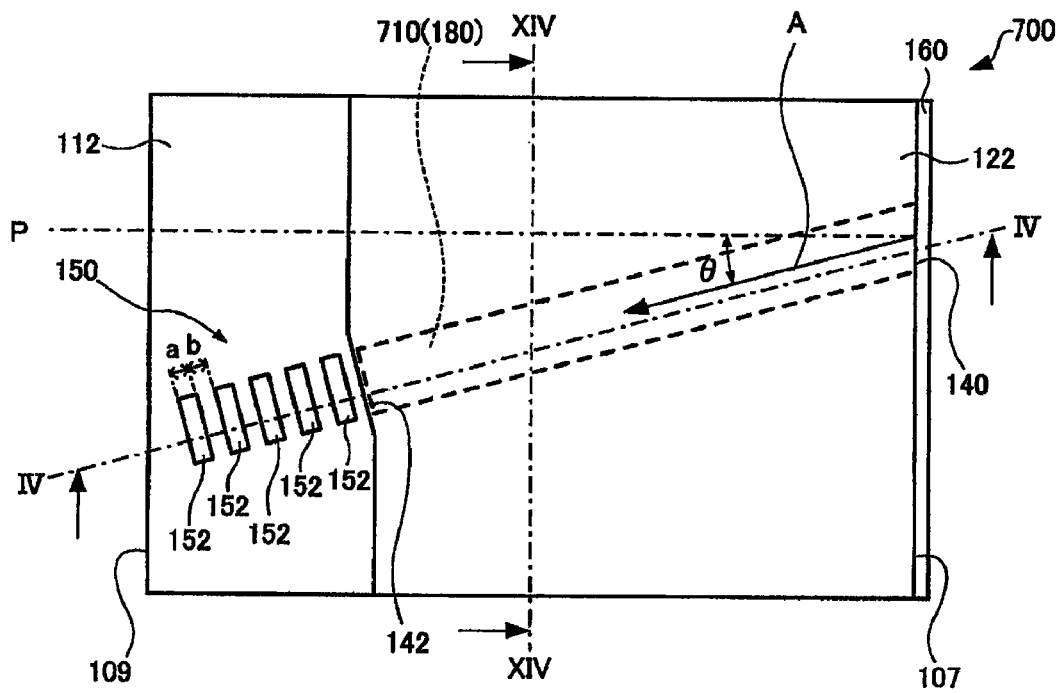
FIG. 13 is a plan view schematically showing the light-emitting device of the second embodiment.

FIG. 13 is a plan view schematically showing the light-emitting device 700, and FIG. 14 is a cross-sectional view along the line XIV-XIV. In the light-emitting device 700 of the second embodiment, the same reference numerals are used for members having the same function as the constituent elements of the light-emitting device 100 of the first embodiment described above, and a detailed described thereof is omitted.

The light-emitting device 700 has a first cladding layer 106, an active layer 108, a second cladding layer 110, insulating parts 702, and a reflective part 150, as shown in FIGS. 13 and 14. The light-emitting device 700 may further include, e.g., a first electrode 120, a second electrode 122, a substrate 102, a buffer layer 104, a contact layer 112, and an antireflective film 160.

In the example of FIG. 13, the contact layer 112 may be formed in a region (excluding the grooves 152) of the second side surface 109 side away from the second end surface 142. The contact layer 112 may have the same flat surface shape as the gain region 180 in the region in which the second electrode 122 is formed. For example, the portion (the upper part of the contact layer 112) of the surface of the second electrode 122 in contact with at least the contact layer 112 may constitute a columnar semiconductor deposit (hereinbelow referred to as "columnar part") 710, as shown in FIG. 14. The first cladding layer 106, the active layer 108, the second cladding layer 110, and the contact layer 112 may constitute the columnar part 710, for example. The second cladding layer 110 and the contact layer 112 may also constituted the columnar part 710, as shown in FIG. 14.

The insulating parts 702 are laterally disposed in relation to the columnar part 710, as shown in FIG. 14. The insulating parts 702 are formed on a layer (second cladding layer 110 in the example of the drawing) that is in contact with the side opposite from the second electrode 122 side of the columnar part 710. The insulating parts 702 are in contact with the side surface of the columnar part 710, as shown in FIG. 14. The electric current between the electrodes 120, 122 can flow through the columnar part 710 sandwiched by the insulating parts 702 while avoiding the insulating parts 702. For example, the flat surface shape of the columnar part 710 determines the electric current pathway between the electrodes 120, 122, and as a result, determines the flat surface shape of the gain region 180. Although not shown, the columnar part 710 and the insulating parts 702 may also be formed on the substrate 102 side. Examples of the insulating parts 702 that may be used include a SiN layer, a $SiO_2$ layer, and a polyimide layer. The insulating parts 702 may be formed in at least peripheral regions of the columnar part 710 as viewed from above. In the example of FIG. 13, the insulating parts 702 may be provided in the same region as the second electrode 122 excluding the region of the columnar part 710.

The insulating parts 702 may cover at least the side surface (surfaces excluding the first end surface 140 and the second end surface 142 of the gain region 180) of the active layer 108, for example. The insulating parts 702 may cover side surfaces other than the first end surface 140 and the second end surface 142 among the side surfaces of the columnar part 710. The insulating parts 702 may have a lower refractive index than the refractive index of the active layer 108. Light can thereby be efficiently sealed inside the active layer 108.

The second electrode 122 is formed, e.g., over the entire surface of the columnar part 710 and insulating parts 702, as shown in FIGS. 13 and 14. Therefore, a light-emitting device 700 can be provided having excellent heat dissipation because the volume of the second electrode 122 is increased in comparison with the example of the light-emitting device 100 described above.

In accordance with the present invention, speckle noise can be reduced, and a novel, high-output light-emitting device can be provided in the same manner as the light-emitting device described above.

2.2. An example of the method for manufacturing the light-emitting device 700 of the second embodiment will be described next with reference to the drawings. However, no limitation is imposed by the following example. A description of the points that are different from the example of the method for manufacturing the light-emitting device 100 of the first embodiment will be provided and a description of the points that are the same will be omitted.

FIG. 15 is a cross-sectional view schematically showing the steps for manufacturing the light-emitting device 700 and corresponds to the cross-sectional view shown in FIG. 14.

(1) First, a buffer layer 104, a first cladding layer 106, an active layer 108, a second cladding layer 110, and a contact layer 112 are formed on the substrate 102.

(2) Next, the second cladding layer 110 and the contact layer 112 are patterned, as shown in FIG. 15. The patterning is carried out using, e.g., a photolithographic technique and an etching technique. A columnar part 710 can be formed in the present step.

(3) Next, grooves 152 are formed, as shown in FIG. 13, for example. The grooves 152 may be formed using, e.g., a photolithographic technique and an etching technique.

(4) Next, the insulating parts 702 are formed so as to cover the side surface of the columnar part 710, as shown in FIG. 14. Specifically, an insulating layer (not shown) is first formed above the second cladding layer 110 (including the top of the contact layer 112) by, e.g., CVD or coating. The upper surface of the contact layer 112 is then exposed by etching, for example. The insulating parts 702 can be obtained by following the steps described above. The grooves 152 may be embedded or not embedded in the step for forming the insulating layer. For example, the insulating layer can be prevented from being embedded in the grooves 152 by applying a resist or another mask (not shown) to the region of the grooves 152.

(5) Next, the first electrode 120 and the second electrode 122 are formed. The second electrode 122 may be formed on the columnar part 710 and the insulating parts 702, as shown in FIG. 13. Therefore, micro patterning is not required and the risk of a broken line in the second electrode 122 can be reduced.

(6) The light-emitting device 700 of the present embodiment can be obtained by following the steps described above, as shown in FIGS. 13 and 14.

2.3. A modified example of the light-emitting device of the present embodiment will be described next. A description of the points that are different from the example of the light-emitting device 700 shown in FIGS. 13 to 14 described above will be provided and a description of the points that are the same will be omitted.

FIG. 16 is a cross-sectional view schematically showing the steps for manufacturing the light-emitting device of the present modified example. The cross-sectional view shown in FIG. 16 corresponds to the cross-sectional view shown in FIG. 14 of the example of the light-emitting device 700.

In the example of the light-emitting device 700, a case was described in which a columnar part 710 is formed in the manner shown in FIG. 15, the insulating layer (not shown) is subsequently formed, and the contact layer 112 is then exposed to thereby form the insulating parts 702. In contrast, in the present modified example, a photoresist or another mask layer 804 is first disposed on the contact layer 112 and covers the region above the gain region 180, as shown in FIG. 16. Next, protons or other ions 806, for example, are injected to depth that reaches, e.g., the second cladding layer 110 using the mask layer 804. The insulating parts 702 of the present modified example can be formed by following the steps described above.

Modified examples are not limited to the examples described above. The modified examples and the example of the light-emitting device 700 may be applied to the embodiments described above as required.

3. Embodiments of the present invention were described in detail above, but those skilled in the art readily understand that it is possible to make many modifications that do not essentially depart from the novel points and effects of the present invention. Therefore, all such modified examples are considered to be included in the scope of the present invention.

What is claimed is:
1. A light-emitting device comprising:
a first cladding layer;
an active layer formed above the first cladding layer;
a second cladding layer formed above the active layer;
a gain region, which generates light by applying a voltage, provided at a portion of the active layer; and a reflecting part reflecting the light generated in the gain region, wherein the active layer has a first side surface and a second side surface that are parallel to each other, the gain region has a first end surface disposed on the first side surface, and the gain region has a second end surface disposed inside from the second side surface side and angled relative to the first side surface, the second end surface, the gain region and the first end surface are provided in a first normal direction relative to the second end surface, and the reflecting part is disposed next to the second end face.

2. The light-emitting device according to claim 1, wherein the reflecting part is a distributed Bragg reflecting mirror.

3. The light-emitting device according to claim 1, wherein the reflecting part includes a plurality of grooves disposed at predetermined intervals.

4. The light-emitting device according to claim 3, wherein the plurality of grooves are rectangular, and a pair of sides facing the plurality of grooves is parallel to the second end surface.

5. The light-emitting device according to claim 3, wherein a bottom surface of the plurality of grooves is disposed below a lower surface of the active layer.

6. The light-emitting device according to claim 3, wherein a bottom surface of the plurality of grooves is disposed above an upper surface of the active layer.

7. The light-emitting device according to claim 1, wherein the reflecting part includes a dielectric multilayer film in which a high-refractive index layer and a low-refractive index layer are layered in alternating fashion in the first normal direction.

8. The light-emitting device according to claim 1, wherein the reflecting part is a metal mirror.

9. The light-emitting device according to claim 1, further comprising a low-reflectivity film disposed on the first end surface.

10. The light-emitting device according to claim 9, wherein the low-reflectivity film is an antireflection film.

11. The light-emitting device according to claim 1, wherein the first end surface and the second end surface is not overlapped each other in a second normal direction relative to the first side surface.

12. The light-emitting device according to claim 1, wherein the gain region is in a stripe shape.

13. The light-emitting device according to claim 1, wherein a plurality of gain regions are provided.

14. The light-emitting device according to claim 1, further comprises:

a first electrode electrically connected to the first cladding layer; and a second electrode electrically connected to the second cladding layer, wherein the voltage is applied to the gain region through the first and second electrodes.

* * * * *